United States Patent [19]

Matsumoto et al.

[11] Patent Number: 5,024,423
[45] Date of Patent: Jun. 18, 1991

[54] SEMICONDUCTOR DIFFUSION FURNACE INNER TUBE

[75] Inventors: Fukuji Matsumoto, Takefu; Yoshio Tawara, Fukui; Michio Hayashi, Takefu; Osamu Yamada, Fukui, all of Japan

[73] Assignee: Shin-Etsu Chemical Co., Ltd., Tokyo, Japan

[21] Appl. No.: 393,779

[22] Filed: Aug. 15, 1989

[30] Foreign Application Priority Data

Aug. 15, 1988 [JP] Japan ............................ 63-202828

[51] Int. Cl.⁵ .............................................. C21B 7/02
[52] U.S. Cl. .................................. 266/283; 266/280; 266/286
[58] Field of Search ................ 266/280, 283, 286, 44, 266/284

[56] References Cited

U.S. PATENT DOCUMENTS 2,609,318  9/1952  Swentzel ................... 266/286
2,640,503  6/1953  Milligan et al. ............ 266/286

FOREIGN PATENT DOCUMENTS 1158839  5/1985  U.S.S.R. ................... 266/280

*Primary Examiner*—S. Kastler
*Attorney, Agent, or Firm*—Birch, Stewart, Kolasch & Birch

[57] ABSTRACT

An inner tube for use in a semiconductor diffusion furnace is provided comprising a liner or diffusion tube and an insulating layer formed on the entire outer surface of the tube by spraying, typically plasma spraying. The sprayed insulating layer is resistant to deterioration and peeling, ensuring an extended period of service for the tube.

8 Claims, 1 Drawing Sheet

SEMICONDUCTOR DIFFUSION FURNACE INNER TUBE

FIELD OF THE INVENTION

This invention relates to inner tubes such as liner tubes and diffusion tubes for use in heat-treating furnaces adapted for oxidation or diffusion in the silicon wafer heat treating process.

BACKGROUND OF THE INVENTION

The semiconductor manufacturing process generally involves heat treatment of silicon wafers in a heating furnace known as a diffusion or oxidation furnace for oxidation, diffusion and CVD purposes. In heat treating silicon wafers in a diffusion furnace, the wafers are placed in an inner tube such as a liner tube and diffusion tube. The liner tube is generally formed of silicon carbide, quartz or mullite while the diffusion tube is formed of quartz or silicon carbide. During repetitive service of the diffusion furnace, the heating coils surrounding the inner tube undesirably, but inevitably deteriorate and sag into contact with the tube. Upon contact with the heating coils, the tube of silicon carbide tends to crack due to arcing because silicon carbide is electroconductive. This is one of major causes for inefficient production in semiconductor manufacture.

To avoid such arcing or cracking, it is a common practice in the art to provide the inner tubes on the outer surface with insulating layers of alumina or zircon base material. The insulating layers are generally formed by adding a binder to powder alumina, silica, zirconia or zircon, coating the mixture to the tube surface, and baking the coating. This process is often designated baking process.

However, the insulating layers thus baked gradually deteriorate and separate from the underlying substrate for a long period of service, eventually powdering into debris. Once the insulating layers are removed, their insulation is of course lost, leaving the risk of failure of the inner tubes themselves upon contact with the heating coils. When the heating coils are in contact with exposed areas of the inner tube where the insulating layer has been stripped, the inner tube is also in electrical contact with the coils with the danger of electrical conduction or shock to the operator if he or she touches the tube. As the insulating layer deteriorates further, it pulverizes into dust which will disperse in the furnace, causing contamination of the clean room in which the diffusion furnace is placed. Such contamination adversely affects the efficient production of semiconductor wafers, leading to low productivity of the semiconductor manufacturing process. The furnace inner tube having an insulating layer formed by the baking process has various problems resulting from deterioration of the insulating layer during an extended period of operation.

The present invention has been made to solve the above-mentioned problems and its object is to provide an inner tube such as a liner tube and diffusion tube for use in semiconductor diffusion furnaces, which inner tube enables consistent heat treatment on semiconductor for an extended period of time without deterioration or separation of the insulating layer.

SUMMARY OF THE INVENTION

The inventors have found that forming an insulating film by the method of spray deposition can advantageously render the film durable and is successful in providing an inner tube which can perform well for an extended period of time. As opposed to the conventional baking process involving adding a binder to ceramics powder, coating the mixture to the tube surface, and heating the coating to a temperature of 800° to 1,200° C. for baking, the spraying process eliminates the need for a binder and forms a film on the tube surface by instantaneously melting starting powder material at 3,000° C. or higher with a DC plasma or the like and causing the partially molten particles to impinge on the tube surface. There is formed a dense film which will not deteriorate or separate for a long period of service at elevated temperatures. There is thus available an inner tube having improved durability.

According to the present invention, there is provided an inner tube for use in a semiconductor diffusion furnace, comprising a liner or diffusion tube and an insulating layer sprayed on the entire outer surface of the tube.

BRIEF DESCRIPTION OF THE DRAWING

The above and other objects, features, and advantages of the present invention will be better understood from the following description taken in conjunction with the accompanying drawing, in which.

the only figure.

DESCRIPTION OF THE PREFERRED EMBODIMENTS

Figure 1:
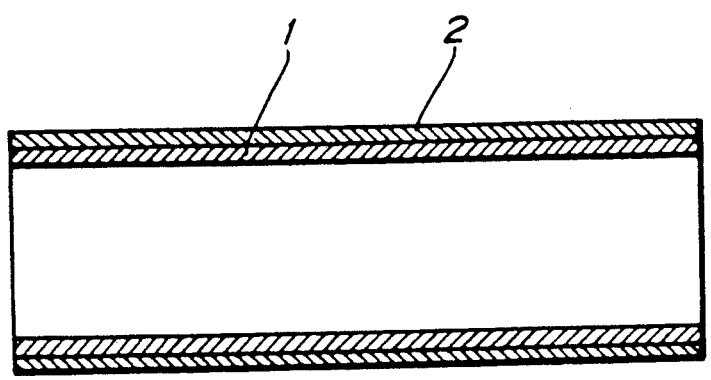
FIG. 1 is a schematic cross section of an inner tube for use in a semiconductor diffusion furnace according to one embodiment of the present invention.

FIG. 1 illustrates an inner tube for use in a semiconductor diffusion furance according to one embodiment of the present invention. The inner tube is illustrated as comprising a liner or diffusion tube (a hollow tubular member 1 having inner and outer cylindrical surfaces). An insulating layer 2 is formed on the entire outer surface of the tubular member by spraying.

The tubular body 1 may be formed of any desired well-known materials, typically silicon carbide. The silicon carbides include those prepared by reactive sintering and recrystallization techniques. The technique for preparing silicon carbide is not critical to the present invention.

The insulating layer 2 may be formed of alumina, silica, zirconia, zircon or a mixture of two or more of them. The insulating layer-forming material is not particularly limited as long as it is heat resistant and electrically insulating. Those insulating materials which do not substantially differ in coefficient of thermal expansion from the tubular body are preferred because they are less likely to separate from the tubular body. For typical tubular bodies of silicon carbide material as mentioned above, the preferred insulating is zircon because of its minimal difference in coefficient of thermal expansion.

The inner tube of the invention has the insulating layer formed over the entire outer surface of the tubular member by the method of spray deposition. More particularly, a mass of powder such as powder alumina, silica, zirconia, and zircon or a mixture thereof is instantaneously melted by means of a spray gun and blown into mist with the aid of blowing gas. The mist is applied to the tubular member on the outer surface to form the insulating layer. Since the tubular member is often a length of tube, it is preferably rotated about its axis during spraying, substantially eliminating a variation in thickness of the insulating layer. To enhance the adhesion of the sprayed layer to the underlying substrate or tubular member, preferably the outer surface of the tubular member is previously roughened as by sand blasting. The spraying process used herein is not particularly limited and may be any of well-known processes including flame spraying, explosive spraying, and plasma spraying. The preferred spraying process is plasma spraying capable of delivering molten particles at a high velocity. For a particular type of plasma spraying, operating conditions may be in accord with the conventional practice.

In forming the insulating layer by the above-mentioned spraying processes, its thickness may be appropriately controlled depending on a particular spraying material and method used as well as a desired dielectric strength. The layers formed by spraying generally have excellent insulation and thus can be reduced in thickness as compared with layers formed by the baking process. In order that the layers formed by the baking process have a dielectric strength of 1,000 volts or higher, their thickness should be 0.3 mm or more, preferably 0.5 mm or more. The layers formed by the spraying process show sufficient insulation at a thickness of about 0.1 mm or more. The provision of a thin coating contributes to an improved dimensional precision of the tube. For example, zircon layers may be formed by plasma spraying to a thickness of about 0.1 to about 0.5 mm, especially about 0.1 mm to about 0.3 mm, obtaining a desired dielectric strength. Although the dielectric strength increases with the layer thickness, thicker layers would sometimes be liable to separate upon thermal cycling.

An inner tube for use in a semiconductor diffusion furnace has be described, which inner tube ensures consistent heat treatment on semiconductor for an extended period of time without deterioration or separation of the insulating layer. From a manufacturing aspect, the inner tube has an improved precision of dimension.

EXAMPLE

Examples of the present invention are given below by way of illustration and not by way of limitation.

Example

A liner tube of silicon carbide having an outer diameter of 198 mm, an inner diameter of 191 mm, and a length of 1,800 mm was roughed on the outer surface to a satin finish by sand blasting. Zircon was plasma sprayed to the satin finished outer surface of the tube to form a zircon layer of 0.2 mm thick thereon. The resulting liner tube was loaded in a diffusion furnace and used for one year. After one year, the liner tube was taken out of the furnace and examined for changes of the insulating layer. No change was observed with respect to color and outer appearance and no separation of the layer was noticed.

Comparative Example

A liner tube of silicon carbide as used in Example was similarly roughed on the outer surface to a satin finish by sand blasting. Zircon powder and alumina cement were blended in a weight ratio of 10:1 and tumbled with water. The resulting slip was coated to the outer surface of the tube. The coated tube was dried for 24 hours at room temperature, placed in a diffusion furnace, heated to 250° C. at a rate of 2° C./min., and maintained at the temperature for 3 hours. The tube was further heated to 1,200° C. at a rate of 5° C./min. and maintained at the temperature for another 3 hours for baking. After the tube was taken out of the furnace, it was loaded in the same diffusion furnace as used in Example, and used for one year under the same conditions as in Example. After one year, the liner tube was taken out of the furnace and examined for changes of the insulating layer. The layer had peeled off at more than ten areas. The layer was so heavily deteriorated that only a touch of fingers caused the layer to scatter powder mist and fall down.

Although some preferred embodiments have been described, many modifications and variations may be made thereto in the light of the above teachings. It is therefore to be understood that within the scope of the appended claims, the invention may be practiced otherwise than as specifically described.

We claim:

1. An inner tube for use in a semiconductor diffusion furnace, comprising
    a linear or diffusion tube formed of a silicon carbide, and
    an insulating layer consisting essentially of a material selected from the group consisting of alumina, silica, zirconia, zircon and mixtures thereof,
    said insulating layer being formed by spray depositing said material on the entire outer surface of said liner or diffusion tube at a thickness of about 0.1 mm to about 0.5 mm.

2. The inner tube of claim 1, wherein said spray depositing comprises instantaneously melting said material at 3000° C. or higher with a DC plasma, and causing the partially molten particles to impinge on the tube surface.

3. The inner tube of claim 1, wherein said material does not substantially differ in coefficient of thermal expansion from said liner or diffusion tube.

4. The inner tube of claim 1, wherein the insulating layer-forming material is zircon.

5. The inner tube of claim 1, wherein the insulating layer-forming material is spray deposited over the entire outer surface of the tubular member by instantaneously melting the insulating material by means of a spray gun, blowing the melted material into a mist with the aid of blowing gas, and applying the mist to the outer surface of the tube while rotating the latter about its axis, thereby forming said insulating layer.

6. The inner tube of claim 1, wherein the outer surface of the tubular member is roughened prior to spray depositing the insulating layer-forming material thereon.

7. The inner tube of claim 1, wherein the insulating layer is spray deposited by flame spraying, explosive spraying, or plasma spraying.

8. The inner tube of claim 1, wherein the insulating layer is spray deposited by plasma spraying.

* * * * *